PARAMETRIC AMPLIFIER WITH BALANCED SELF-RESONANT DIODES

Filed May 1, 1962 2 Sheets-Sheet 1

INVENTOR
JANS KLIPHUIS
BY Pennie, Edmonds, Morton, Barrows and Taylor
ATTORNEYS

PARAMETRIC AMPLIFIER WITH BALANCED SELF-RESONANT DIODES

Filed May 1, 1962 2 Sheets-Sheet 2

INVENTOR
JANS KLIPHUIS

BY Pennie, Edmonds, Morton, Barrows and Taylor
ATTORNEYS

United States Patent Office 3,105,941

Patented Oct. 1, 1963

3,105,941

PARAMETRIC AMPLIFIER WITH BALANCED SELF-RESONANT DIODES

Jans Kliphuis, Huntington, N.Y., assignor to Cutler-Hammer, Inc., Milwaukee, Wis., a corporation of Delaware Filed May 1, 1962, Ser. No. 191,551
6 Claims. (Cl. 330—4.9)

This invention relates to variable reactance devices, and particularly parametric amplifiers.

Parametric amplifiers have been found useful because of their low-noise properties. Although such amplifiers have been the subject of extensive research and development, there is a continuing requirement for improvements yielding low-noise amplifiers with large gain-bandwidth products. In addition, it is desirable that such an amplifier be adjustable or tunable over a large bandwidth while maintaining a low noise figure and a large gain-bandwidth product.

In general, a parametric amplifier has a variable reactance component, commonly a variable capacitance diode, and its reactance is varied at a pump frequency that is higher than the signal frequency, and a signal is applied to the variable reactance to obtain amplification thereof.

In operation of a parametric amplifier, a frequency equal to the difference between the pump and signal frequencies, often called the "idler" frequency, is developed. In one mode of operation the pump frequency is approximately twice the signal frequency, so that the signal and idler frequencies are nearly the same. In another mode of operation, the pump frequency is considerably greater than twice the signal frequency, so that the signal and idler frequencies are quite widely separated. This latter mode of operation in general gives better noise performance, as well as other operating advantages. The present invention is particularly directed to this type of operation.

With the idler frequency considerably higher than the signal frequency, an amplified output signal can be obtained which has the same frequency as the input signal. It is also possible to obtain an amplified output signal at the idler frequency. In the specific embodiments hereinafter described, the output signal is at the same frequency as the input signal. However, it is possible to modify the arrangement shown to obtain an output at the idler frequency.

Theory defining the conditions necessary for obtaining an optimum noise figure and a large gain-bandwidth product with a given variable-capacitance diode has been developed. Developments leading up to and including the present invention have proved the validity of the theory that for a low noise figure, it is desirable to avoid external idler circuit loading, and for a large gain-bandwidth product it is desirable to use the self-resonant frequency of the diode as the idler frequency.

A further problem in designing a satisfactory parametric amplifier is adequate isolation of the signal and idler frequencies. While many arrangements have been proposed, in general they involve a degradation of the gain-bandwidth product.

The present invention provides a relatively simple and practical arrangement in which external idler circuit loading may be avoided, substantially the self-resonant frequency of the diode may be used as the idler frequency, and adequate isolation of the signal and the idler circuits may be obtained without additional filter circuits in the signal and idler circuits.

In accordance with this invention, a parametric amplifier is provided having two matched variable capacitance diodes, with each diode plus the inductance in the connections associated therewith selected to be resonant at a desired idler frequency. The diodes are connected in parallel between a common junction and a reference potential, usually ground. The diodes are supplied with high frequency pump oscillations and are so arranged that in operation their capacities are varied about their average values in phase opposition with each other with respect to the junction therebetween. Thus, the increase in capacitance of one diode is accompanied by a decrease in capacitance of the other. The signal frequency to be amplified is supplied to the junction of the diodes through an inductance which resonates with the average values of the reactances of the diodes at the signal frequency.

The resultant idler frequencies in the two diodes are in phase opposition at the common junction point, and hence the idler frequency does not propagate on the input signal frequency line. This isolation is effective over a comparatively wide frequency band, without appreciable loading, thus allowed large gain-bandwidth products to be obtained. By changing the bias on the diodes, or the pump power level, the self-resonance frequency may be changed, thus allowing convenient tuning of the idler frequency over a considerable frequency range so as to amplify signals in a corresponding range. Additional features will be pointed out hereinafter.

A specific embodiment of this invention is described below with reference to the drawings in which.

Figures 1, 2:
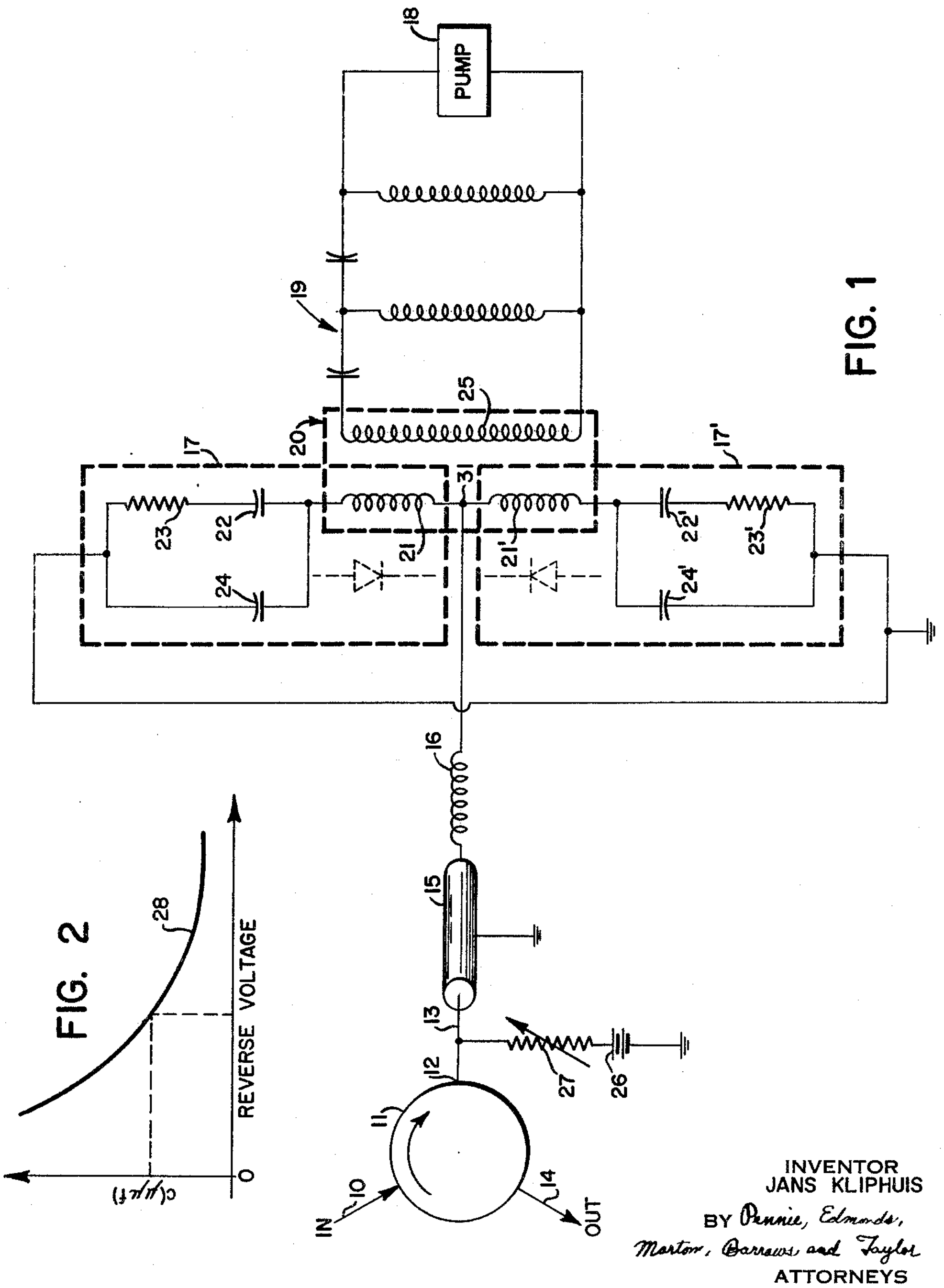
FIG. 1 shows a schematic equivalent circuit of a balanced parametric amplifier.
FIG. 2 shows a capacitance characteristic curve of a variable capacitance diode.

Referring to FIG. 1, an input signal is supplied to port 10 of a circulator 11, and thence from port 12 to line 13 for amplification. The amplified output signal in line 13 returns to the circulator through port 12 and is delivered to output port 14 of the circulator. Such circulators are well known in the microwave art and need not be described in detail.

An impedance-matching coaxial section 15 is provided to change the characteristic impedance of the circulator to a lower value that is required to obtain the necessary gain and bandwidth response from the circuit. The input signal is supplied through an inductance 16 to a pair of substantially identical variable capacitance diodes whose lumped-constant, equivalent circuits are shown within dotted boxes 17, 17'. The diodes are connected together with opposite polarity, as indicated in phantom. A source of pump power 18 is coupled to the diodes through a circuit component functioning as a high pass filter, indicated at 19, and a transition represented as a transformer shown within dotted box 20 and to be described below.

In the equivalent circuits 17, 17' of the diodes, inductances 21, 21' are primarily the lead inductances, capacitances 22, 22' are the junction capacitances which are varied about their average values at the pump frequency by the pump signal, resistances 23, 23' represent the loss components, and capacitances 24, 24' are the stray capacitances. These parameters vary for different diodes and are affected by the manner in which diodes are mounted in various applications, but any two diodes used herein are matched to be substantially identical and are mounted in the same way.

Each of the junction capacitances 22, 22' has an average value under pumped conditions which may be denoted $C_0$, and which varies about this average value during each pump signal cycle in phase opposition as will be explained below. The stray capacitances 24, 24' may be denoted $C_s$. Each of the inductances 21, 21' will resonate with the sum of $C_0$ and $C_s$ at a frequency which may be termed the self-resonant frequency of the diodes.

The pump input is supplied to the two diodes 17, 17' through an equivalent transformer 20 shown as comprising an inductance 25 in the high-pass filter section 19 and the inductances of the leads of the diodes 21, 21', so that the pump signal input is applied to the two diodes 17, 17' in phase opposition with respect to point 31.

The interaction of the signal frequency input and the pump frequency input produces idler frequency oscillations in the two diodes 17, 17'. Because of the relative phase relationship between the pump potential and the signal potential in the diodes and the orientation of the diodes in the idler circuit, the diodes oscillate in phase opposition at the selected idler frequency of the diodes. Bias, if any, required to produce resonance at the desired idler frequency (which as explained above is the difference between the pump frequency and the signal frequency) is applied by a battery 26 and rheostat 27 connected to the center conductor 13 of the coaxial input line.

The pump frequency input is supplied through equivalent transformer 20 from primary 25 to secondaries 21 and 21' as explained above. At a particular instant, assume the instantaneous pump potential to be greater at the upper end of the primary winding 25 than at the bottom end. Then, the instantaneous pump potential at the point between secondary winding 21 and capacitor 22 will be positive with respect to the instantaneous pump potential at the junction between secondary 21' and capacitance 22'. Because secondary inductances 21 and 21' are matched and equally coupled to primary 25, the instantaneous pump potential at point 31 will be substantially zero at all times. Thus the capacitances of 22, 22' will be changed in opposite directions by the pump power, and there will be little propagation of pump power in the input signal circuit.

The signal potential applied to point 31 will be in the same direction in the two diodes, with respect to ground. The resultant instantaneous value of the idler frequency potentials produced will be out of phase at point 31. Consequently, with adequately close matching of the diodes, little if any idler frequency potential will exist at point 31, and hence there will be little if any idler frequency propagation on the signal frequency line.

There is effectively no loading of either diode by the signal input line at the idler frequency because of the substantially zero idler potential with respect to ground at the point 31. Although the iductance 16 is sufficiently low to be resonant with the capacitance of the two diodes in parallel at the lower signal frequency, its reactance is much higher at the idler frequency so that little idler current can flow therethrough even if there is some mismatch of diodes.

The high-pass filter 19 is selected to be cut off well above the range of idler frequencies to which the idler circuit will be tuned. Accordingly, little propagation can occur through the filter at the idler and signal frequencies.

The pump source can be rather closely coupled to the idler circuit at the pump frequency and accordingly pump circuit efficiency can be relatively high. However, filter 19 prevents the pump source from loading the idler circuits appreciably at the idler frequency.

For effective application of the signal voltage across the diodes 17, the inductance 16 may be selected to be resonant with the paralleled average idler junction capacitances $C_0$ (22, 22') for a given amount of bias and pump power level. In order to tune the idler circuit to a different resonant frequency, so as to amplify a different input signal frequency, the average value of the junction capacitances $C_0$ can be adjusted as explained in greater detail below with reference to FIG. 2. By varying the average capacitance $C_0$ of each diode, the resonant frequencies of the idler and signal circuits will change in the same direction. Thus the tuning of the signal circuit will be adjusted in the reverse direction to that desired, and will be slightly off resonance at the signal frequency. However, since the signal circuit has a broad bandwidth, this will be of little importance. If desired, inductance 16 may be adjusted to preserve resonance.

FIG. 2 shows a capacitance characteristic 28 for an individual diode 17 or 17' plotted as a function of the reverse voltage across the respective diode. For convenience, the diode internal potential is included in the reverse voltage. As is evident from characteristic 28, as the reverse bias voltage is increased the capacitance initially decreases rapidly and then decreases more slowly, asymptotically approaching a minimum value. Thus considerable adjustment in $C_0$ can be obtained by varying the bias on the diodes in tuning the circuit.

Figure 3:
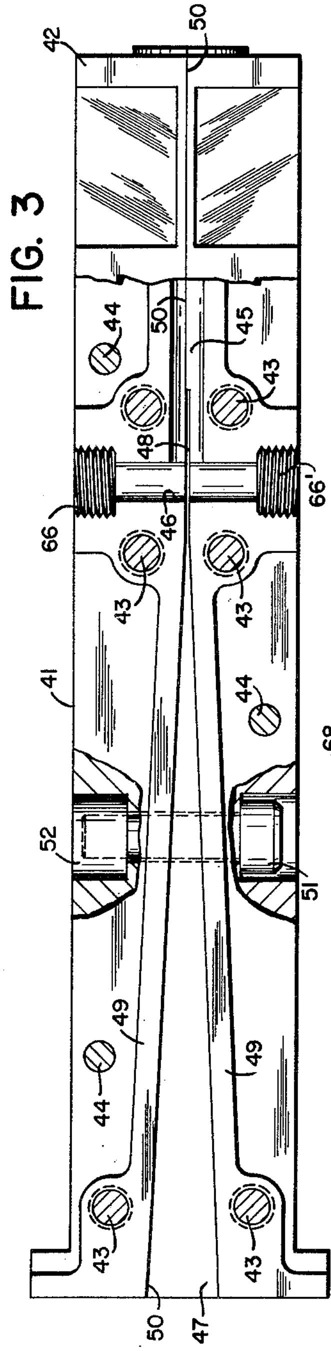
FIG. 3 is a partially cut-away view of an assembled housing for a balanced parametric amplifier.

FIG. 3 shows a structure essentially embodying the schematic circuit of FIG. 1. A metal housing composed of brass or the like is composed of two pieces 41 and 42 fastened together by machine screws 43 shown in section and aligned by guide dowels 44. Most of the upper piece 42 has been broken away and circuit components have been removed to show the internal structure. The upper piece is symmetrical to the lower piece 41. An axial bore 45 in one end of the housing forms the outer conductor of a coaxial line section. A transverse bore 46 counterbored and tapped at its ends is located intermediate the ends of the housing and has its axis normal to and intersecting with the axis of the axial bore. A rectangular waveguide section 47 formed in the opposite end of the housing is tapered laterally into a vertical slot 48 at bore 46 to provide a waveguide to coaxial transition. At the intersection of the axial and transverse bores 45, 46 the slot 48 has a very thin transverse cross-section of rectangular shape extending a small distance on the order of a quarter wavelength in the range of the pump frequency beyond bore 46, so as to maximize the pump power applied to the diodes. The dimensions of the waveguide are selected so that the cutoff frequency is below the pump frequency but above the idler frequency.

Preferably, as shown, the confronting surfaces of the pieces bordering the bores and the waveguide are slightly elevated as indicated by numeral 49, and smooth to provide good contact and prevent leakage. For convenience of fabrication and machining, each piece is formed by two fitted members joined at line 50—50, along one side of the waveguide section 47, lengthwise of each piece. The members are retained in tight contact by nuts and bolts 51, 52 through the sides of the piece at several points along the length thereof as shown where piece 41 is partially cut-away.

Figure 4:
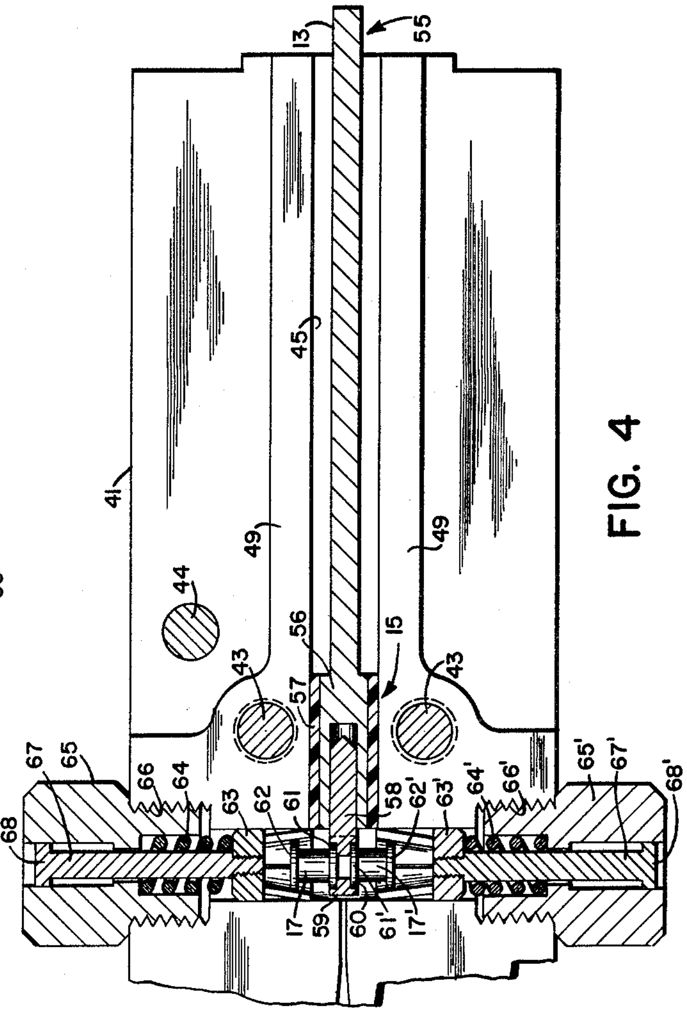
FIG. 4 shows a fragmentary, partially sectional view of a parametric amplifier in the housing shown in FIG. 3.
Figure 5:
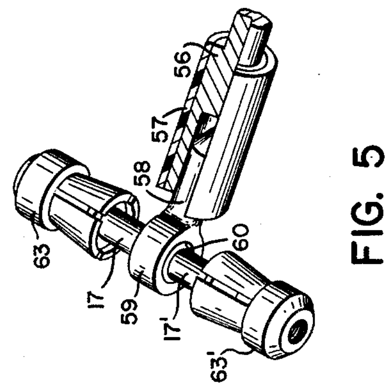
FIG. 5 shows a fragmentary, partially sectional perspective view of some components of the amplifier shown in FIG. 4.

FIG. 4 shows a partially sectional, fragmentary view of the components of the circuit inserted in piece 41. FIG. 5 shows another partially sectional, fragmentary, oblique view of those components removed from the housing. Signal power is propagated in the TEM mode along the coaxial line 55 formed by center conductor 13 and axial bore 45. The center conductor 13 is terminated in a hollow section 56 of greater diameter which is substantially one-quarter wavelength long in the range of the signal frequency providing a part of the quarter-wave impedance matching section 15 shown in FIG. 1. Covering the hollow section 56 is a sleeve 57 of dielectric material, such as polytetrafluoroethylene or the like, which also supports the center conductor and the hollow section in the bore. The characteristic impedance of the coaxial line is determined primarily by the ratios of the diameters of the center conductor 13 and the bore 45. Since this differs from the characteristic impedance of the input coupling to the circulator, impedance transformation section 15 is provided. The properties of the type of transition shown are well known to those skilled in the art and are determined by the relationship between the diameters of the hollow section 56 and the central conductor 13 and by the dielectric constant of the sleeve 57.

Extending beyond the section 15 is a short length of a stub line 58 which is inserted at one end in the space in hollow section 56 and in electrical contact therewith. The length of stub line 58 extending beyond the hollow section provides an inductance corresponding to inductance 16 shown in FIG. 1 to provide series resonance in the signal frequency circuit. The stub is integral at its opposite end with an annular conductive fitting 59 having an opening 60 therethrough counterbored at each end and coaxially aligned with the transverse bore 46 in the housing. Each counterbore in the fitting is provided to receive one of the terminals 61, 61' of each of the pair of matched diodes 17, 17' and the fitting is retained in electrical contact therewith. The shape of the fitting is a matter of choice and it can be disc-shaped with or without recesses, as long as it is suitable for retaining the leads 61, 61' of the diodes. The leads must be in good contact with the fitting, and means described below are provided to assure firm contact. Inductance exists between the diodes consisting of the so-called "parasitic" inductance 21, 21' of the leads and the inductance of the fitting which is relatively small because of the slot 48 therearound providing the coupling transition, shown as transformer 20 in the equivalent circuit.

Attached to the lead at the opposite end of each of the diodes, both of which are reel-shaped but which can have many other configurations, is one of a pair of contact members 63, 63' shown having four "spring fingers" which hold or "grasp" the periphery of the disc-shaped leads 62, 62' on the opposite ends of the diodes. Urging each of the contact members 63, 63' into tight electrical contact with the leads 62, 62' is a spring 64, 64' bearing on the base of the head of one of adjusting bolts 65, 65' the threads of which are received in the tapped ends 66, 66' of the axial bore 46. Each of a pair of rod members 67, 67' having a threaded projection at one end thereof which is received in a tapped coaxial hole in the contact member, has a head 68, 68' at the opposite end. Each rod extends through a hole in the knurled bolts 65, 65' associated therewith which are counterbored to receive the head 68, 68' when the bolt is removed from the bore 46 and can be used to withdraw the diodes. The head 68, 68' engages with the base of the counterbore thereby withdrawing the spring 64, 64', contact member 63, 63' and the diode 17, 17' from the bore 46, 46'. In addition, the rod provides alignment of the spring and prevents twisting and transverse rather than axial forces from being exerted by the spring. The rod and spring can be eliminated if desired.

The aligned structure comprising the diodes, the contact members, and the annular fitting in the transverse bore comprises the central conductor of a coaxial line short circuited at its ends by the contact members. The outer conductor comprises the bore 46 and the slot 48 in the middle thereof. The slot 48 produces an inductive effect upon the annular fitting 59 which results in a relatively small inductance appearing as a part of the lead inductance of the two diode equivalent circuits as explained in connection with FIG. 1.

In use, the structure shown in FIG. 3 is connected to a circulator joined to the open end of coaxial line 55 and to a source of pump frequency power through the end of the waveguide section 47.

The structure shown is compact, rugged, and mechanically simple. Adjustment of the contacts can be made relatively easily. The diodes and the assembly connected with each thereof can be removed easily.

When it is desired to tune the inductance 16 in the signal circuit, the length of the stub 58 extending from the hollow section 56 can be adjusted by moving the center conductor 13 in the direction desired to alter the effective length of the stub inductance.

Bias can be connected to the center conductor 13 and supplied to both of the diodes 17, 17' through the annular fitting 59 with the return path to ground being provided through the contact members 63, 63' and the housing.

Tuning of the amplifier may be effected when it is desired to operate at a different frequency, by varying the bias which as explained above varies the average capacitance of the diode in proportion to the bias. While the diodes can be operated at zero bias it is preferable to provide a negative bias substantially above the reverse breakdown potential of the diode. In addition, the pump power level impressed on the diode must be sufficiently low to prevent anomalous reverse currents. Diodes having anomalous reverse current characteristics somewhat above the reverse breakdown potential produce noise tending to degrade the quality of the signal produced by the amplifier when pumped into that region of operation.

The principles and advantages of this invention are not restricted to the embodiments thereof illustrated in the drawings and those discussed in the preceding description. For example, one of the diodes can be connected in reverse to the direction shown in the drawings. The pump signal can be applied to the coaxial line and supplied along with the signal frequency to the idler circuit where the capacitance of the diodes will again be varied in phase opposition. A low pass filter in the signal circuit and a high pass filter in the pump circuit can be used to isolate the signal and pump frequencies and so long as the pump and signal frequencies are separated by a factor of two, there will be no degradation of the bandwidths of either circuit.

In addition the output of the structure can be taken at the idler frequency through the waveguide section for the structure shown in FIGS. 3, 4 and 5 by modifying the shape of the pump input waveguide to permit propogation at the idler frequency or in the alternative another waveguide can be used to remove idler power. If one of the diodes is reversed in its polarity as described above, then isolation from the pump signal source can be obtained because the pump input is then introduced to the diodes on a coaxial line in the TEM mode and the idler frequency can be taken from the circuit by a section of waveguide.

The invention has been described in connection with a specific embodiment incorporating a number of features contributing to the overall operation. It will be understood that some of these features may be employed and others omitted as meets the requirements of a particular application. Also, the particular coupling and isolating features of the physical embodiment of FIGS. 3–5 may be useful in devices other than parametric amplifiers.

I claim:

1. In a parametric amplifier, the combination which comprises (*a*) a pair of substantially matched variable capacitance diodes connected in series to provide an idler circuit, (*b*) means for supplying pump frequency power to vary the variable capacitances of said diodes in balanced phase opposition with respect to a junction therebetween, (*c*) and means for supplying signals to said junction, (*d*) said pump frequency being high compared to the frequency of signals supplied to said junction to produce an idler frequency equal to the difference therebetween which is substantially higher than the signal frequency, (*e*) said diodes being substantially self-resonant at said idler frequency, (*f*) whereby idler frequencies are produced in said diode self-resonant circuits which are substantially in phase opposition at said junction.

2. In a parametric amplifier, the combination which comprises (*a*) a pair of substantially matched variable capacitance diodes connected in series to provide an idler circuit, (*b*) means for supplying pump frequency power to vary the variable capacitances of said diodes in balanced phase opposition with respect to a junction therebetween, (*c*) an input circuit for supplying signals to said junction, (*d*) said pump frequency being high compared to the frequency of signals supplied to said junction to produce an idler frequency equal to the difference therebetween which is substantially higher than the signal frequency, (*e*) said diodes being substantially self-resonant at said idler frequency, (*f*) and a series inductance in said input circuit predetermined to provide substantially series resonance with the average capacitive reactance of said diodes at the signal frequency, (*g*) said signal and pump frequencies producing idler frequencies in said diode self-resonant circuits which are substantially in phase opposition at said junction.

3. Apparatus in accordance with claim 2 in which said pump frequency power is supplied to the diodes through transmission means having a high pass characteristic with a cutoff lying between the idler and pump frequencies.

4. Apparatus in accordance with claim 3 including means for adjustably biasing the diodes to adjust the self-resonant frequencies thereof.

5. In a parametric amplifier, the combination which comprises, (*a*) an idler circuit including a pair of matched variable capacitance diodes with anodes and cathodes thereof respectively connected together, (*b*) means for supplying pump frequency power to said diodes in phase opposition with respect to a junction point therebetween to vary the diode capacitances in opposite directions, (*c*) means for supplying an input signal to said junction point, (*d*) said pump frequency being high compared to the frequency of said input signal to produce an idler frequency equal to the difference therebetween which is substantially higher than the signal frequency, (*e*) an inductor having an inductance value predetermined to provide series resonance with substantially the average capacitive reactance of said diodes, said inductor being connected in series with said means for supplying an input signal, (*f*) and means for isolating energy at said idler frequency in said idler circuit from said means for supplying pump frequency power comprising a coupling having substantially a high pass filter characteristic cut-off at said idler frequency.

6. In a microwave circuit, the combination which comprises a conductive metal housing having (*a*) an axial bore extending to a point intermediate thereof, (*b*) a transverse bore intersecting said axial bore interiorly of said housing, (*c*) a tapered section of waveguide opening on one end of said housing and terminating adjacent said transverse bore and intersecting therewith, (*d*) a conductor disposed coaxially of said axial bore providing a coaxial transmission line for propogation of a signal therein, (*e*) an impedance transformation section attached to the inner end of said coaxial line, (*f*) a short second conductor extending coaxially from the opposite end of said impedance transformation section comprising an inductance at the frequency to be propagated through said axial bore, (*g*) a conductive fitting connected to the opposite end of said second conductor axially aligned with said transverse bore supported in spaced position with respect to the walls of said bores, (*h*) a pair of variable reactance diodes each having one of the terminals thereof in electrical contact with a different side of said fitting, said diodes being positioned substantially coaxially of said transverse bore and grounded to said housing at the opposite ends thereof, the series combination including said diodes comprising a circuit resonant at substantially the self-resonant frequency of said diodes, (*i*) said inductance and said diodes comprising a circuit resonant at a frequency substantially lower than said self-resonant frequency, (*j*) said tapered section of waveguide being cut-off below a frequency above the self-resonant frequency of said diodes.

References Cited in the file of this patent

UNITED STATES PATENTS

| | | |
|---|---|---|
| 2,951,207 | Hudspeth | August 30, 1960 |
| 3,050,689 | De Loach | August 21, 1962 |

FOREIGN PATENTS

| | | |
|---|---|---|
| 1,238,790 | France | July 11, 1960 |

OTHER REFERENCES

Greene et al.: "Proceedings of the IRE", September 1960, pages 1583–1590.